United States Patent
Gauthier et al.

(10) Patent No.: US 6,778,027 B2
(45) Date of Patent: Aug. 17, 2004

(54) PHASE LOCKED LOOP INPUT RECEIVER DESIGN WITH DELAY MATCHING FEATURE

(75) Inventors: Claude Gauthier, Fremont, CA (US); Pradeep Trivedi, Sunnyvale, CA (US); Brian Amick, Austin, TX (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/121,806

(22) Filed: Apr. 12, 2002

(65) Prior Publication Data

US 2003/0193375 A1 Oct. 16, 2003

(51) Int. Cl.[7] .............................................. H03L 7/00
(52) U.S. Cl. .............................. 331/17; 331/25; 331/34
(58) Field of Search ..................................... 331/25, 34

(56) References Cited

U.S. PATENT DOCUMENTS 6,043,717 A * 3/2000 Kurd .......................... 331/17
6,542,038 B2 * 4/2003 Nishimura et al. ........... 331/25

FOREIGN PATENT DOCUMENTS

JP                5129944      * 5/1993

OTHER PUBLICATIONS

Lee et al. "Design Self–Synchronized Clock Distribution Networks in an SOC ASIC using DLL with Remote Clock Feedback" 13th Annual IEEE International ASIC/SOC Conference 2000 pp 248–252.*

Gibilisco "Handbook of Radio & Wireless Technology" McGraw Hill 1999 pp 90–93.*

"Low–Jitter Process–Independent DLL and PLL Based on Self–Biased Techniques" Author: John G. Maneatis as published in IEEE Journal of Solid–State Circuits, vol. 31, No. 11 Nov. 1996 (11 pages).

* cited by examiner

*Primary Examiner*—Michael B. Shingleton
(74) *Attorney, Agent, or Firm*—Rosenthal & Osha L.L.P.

(57) ABSTRACT

A phase locked loop that includes a receiver circuit for matching delays of a system clock and a feedback clock at an input of the phase locked loop is provided. The receiver circuit employs system clock path circuitry to input the system clock and feedback clock path circuitry to input the feedback clock, where current flow and load resistances associated with the system clock path circuitry and current flow and load resistances associated with the feedback clock path circuitry control the generation of substantially delay matched system and feedback clocks.

35 Claims, 4 Drawing Sheets

PHASE LOCKED LOOP INPUT RECEIVER DESIGN WITH DELAY MATCHING FEATURE

BACKGROUND OF INVENTION

Figure 1:
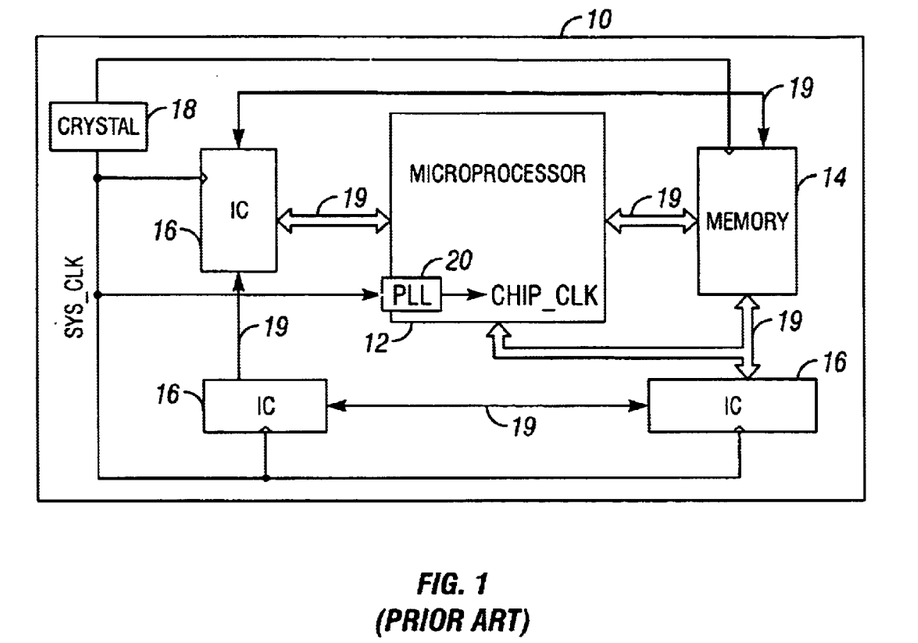
FIG. 1 shows a typical computer system.

As shown in FIG. 1, a typical computer system 10 has, among other components, a microprocessor 12, one or more forms of memory 14, integrated circuits 16 having specific functionalities, and peripheral computer resources (not shown), e.g., monitor, keyboard, software programs, etc. These components communicate with one another via communication paths 19, e.g., wires, buses, etc., to accomplish the various tasks of the computer system 10.

In order to properly accomplish such tasks, the computer system 10 relies on the basis of time to coordinate its various operations. To that end, a crystal oscillator 18 generates a system clock signal (referred to and known in the art as "reference clock" and shown in FIG. 1 as SYS_CLK) to various parts of the computer system 10. Modern microprocessors and other integrated circuits, however, are typically capable of operating at frequencies significantly higher than the system clock, and thus, it becomes important to ensure that operations involving the microprocessor 12 and the other components of the computer system 10 use a proper and accurate reference of time.

One component used within the computer system 10 to ensure a proper reference of time among a system clock and a microprocessor clock, i.e., "chip clock," is a type of clock generator known as a phase locked loop, or "PLL" 20. The PLL 20 is an electronic circuit that controls an oscillator such that the oscillator maintains a constant phase relative to a reference signal. Referring to FIG. 1, the PLL 20 has as its input the system clock, which is its reference signal, and outputs a chip clock signal (shown in FIG. 1 as CHIP_CLK) to the microprocessor 12. The system clock and chip clock have a specific phase and frequency relationship controlled by the PLL 20. This relationship between the phases and frequencies of the system clock and chip clock ensures that the various components within the microprocessor 12 use a controlled and accounted for reference of time. When this relationship is not maintained by the PLL 20, however, the operations within the computer system 10 become non-deterministic.

Figure 2:
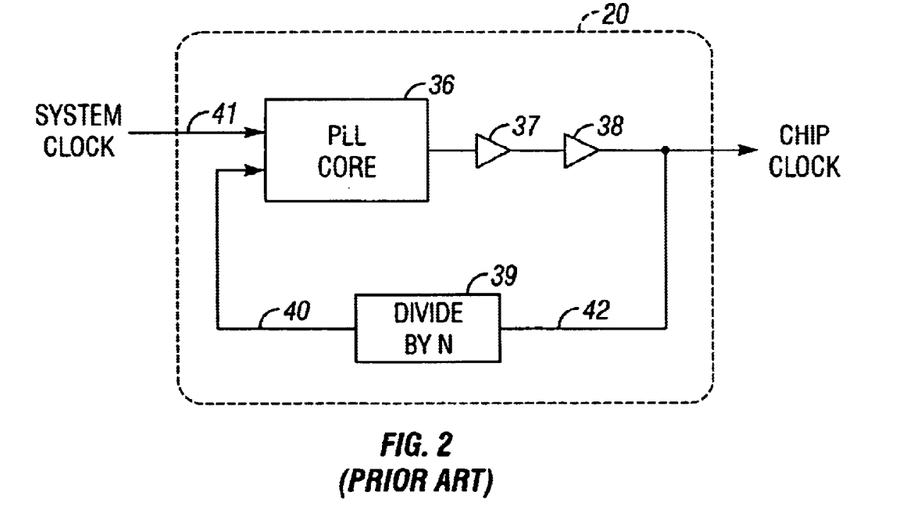
FIG. 2 shows a block diagram of a typical phase locked loop.

FIG. 2 shows a PLL 20. The PLL 20 comprises a feedback loop that aligns the transition edge and frequency of the system clock 41 and a feedback loop signal 40. The PLL 20 adjusts the output frequency in order to zero any phase and frequency difference between the system clock 41 and the feedback loop signal 40. The addition of a divide-by-N circuit 39 in the feedback loop enables the PLL 20 to generate an output that has a frequency of N times the system clock 41 frequency. Multiplying the system clock is useful when the chip clock 42 must have a higher frequency than the system clock 41. The PLL core 36 adjusts the output frequency in order to zero any phase and frequency difference between the system clock 41 and the feedback loop signal 40. By adding the divide by N block 39, the chip clock 42 must be N times faster to allow the phase and frequency difference between the system clock 41 and the feedback loop signal 40 to zero. The PLL 20 may also have buffers 37 and 38 to drive a larger resistive and/or capacitive load. The buffers 37 and 38 are in the feedback loop so that any phase shift created by the buffers 37 and 38 is zeroed by the PLL core 36.

One common performance measure for a PLL is jitter. Jitter is the time domain error from poor spectral purity of an output. In other words, in a repeated output pattern, such as a clock signal, a transition that occurs from one state to another does not happen at the same time relative to other transitions. Jitter represents the perturbations that result in the intermittent shortening or lengthening of signal elements of an output. The system clock may have jitter that may need to be filtered by the PLL. The PLL may need to follow and compensate for jitter at the PLL output.

Phase locked loops are basically second order feedback control systems. As such, the phase locked loop can be described in the frequency domain as having a damping factor and natural frequency. The damping factor and natural frequency are fixed by the selection of the PLL circuit parameters. The loop bandwidth is defined as the PLL input frequency at which the PLL output magnitude is 3 dB lower than the PLL output magnitude when the PLL input frequency is zero (DC). The loop bandwidth determines to a large degree the speed at which the phase locked loop can react to a disturbance. The PLL should have a low loop bandwidth so that input clock jitter is filtered. Power supply noise will, however, have a certain noise-versus-frequency characteristic. The PLL loop bandwidth may need to be increased to recover from the generation of output jitter caused by power supply noise.

SUMMARY OF INVENTION

According to one aspect of the present invention, a phase locked loop comprises: a voltage controlled oscillator that generates an output clock signal dependent on an input thereto; an input receiver comprising an input clock path and a feedback clock path, where the input receiver is configured to substantially match a delay of an input clock signal through the input clock path and a delay of a feedback clock signal through the feedback clock path, and where the feedback clock signal is dependent on the output clock signal; a phase frequency detector that detects a phase difference between the substantially delay matched input and feedback clock signals; and a bias generator, responsive to the phase frequency detector, arranged to provide a voltage to the input of the voltage controlled oscillator.

According to another aspect, an integrated circuit comprises a clock path used for propagating a system clock, a clock distribution network used for propagating a chip clock, and a phase locked loop that generates the chip clock based on the system clock, where the phase locked loop comprises: a voltage controlled oscillator that generates an output clock signal dependent on an input thereto; an input receiver configured to substantially match delays through the input receiver of the system clock and a feedback clock; a phase frequency detector that detects a phase difference between the substantially delay matched system and chip clocks; and a bias generator, responsive to the phase frequency detector, arranged to provide a voltage to the input of the voltage controlled oscillator.

According to another aspect, an integrated circuit that has a phase locked loop that inputs an input clock signal comprises: oscillator means for generating an output clock signal; delay matching means for substantially matching delays through the delay matching means of the input clock signal and a feedback clock signal, where the feedback clock signal is dependent on the output clock signal; comparing means for comparing the substantially delay matched input clock and feedback clock signals; and means for generating a voltage to the oscillator means based on the comparing means.

According to another aspect, a method for performing phase locked loop operations comprises: inputting an input clock signal and a feedback clock signal; buffering the input clock signal and the feedback clock signal, where the buffering comprises substantially matching delays of the input clock signal and the feedback clock signal; comparing the substantially delay matched input and feedback clock signals; and generating an output clock signal based on the comparison.

Other aspects and advantages of the invention will be apparent from the following description and the appended claims.

BRIEF DESCRIPTION OF DRAWINGS

FIG. 4b shows a portion of a phase locked loop in accordance with the embodiment shown in FIG. 4a.

DETAILED DESCRIPTION

Figure 3A:
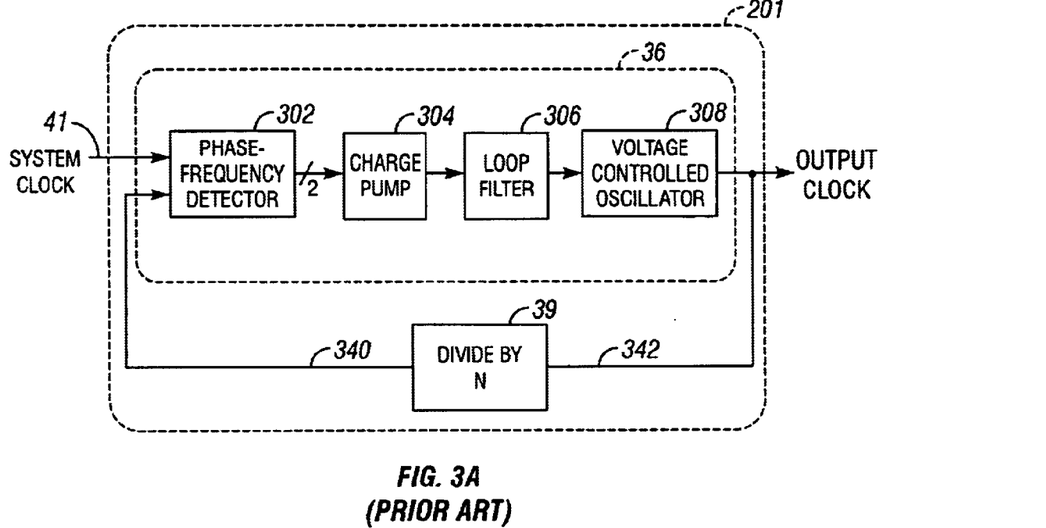
FIG. 3a shows a circuit diagram of a phase locked loop.

FIG. 3a shows a diagram of a PLL 201. The PLL 201 has an input of system clock 41 that is used to create a phased output, output clock 342. The basic elements of the PLL core 36 are a phase-frequency detector 302, charge pump 304, loop filter 306, and voltage-controlled oscillator 308. Output clock 342 may have a higher frequency than the system clock 41. A divide-by-N circuit 39 is used to reduce the frequency of the output clock 342 so that the system clock 41 and divided output clock 340 can be input to the phase-frequency detector 302. The phase-frequency detector 302 measures the phase and frequency difference between system clock 41 and divided output clock 340. The phase-frequency detector 302 produces signals that control a charge pump 304, typically up or down pulses (not shown), to increase or decease the net charge at the output of the charge pump 304. The charge pump 304 adds or removes charge from the loop filter 306. The loop filter 306 may be composed of a resistor and capacitor in series that are connected to ground. The charge pump 304 adjusts the voltage stored on the capacitor in the loop filter 306. The voltage-controlled oscillator 308 produces the output clock 342 that has a frequency proportional to the voltage input to the voltage-controlled oscillator 308. Because the voltage input to the voltage-controlled oscillator 308 may be susceptible to power supply noise, the output clock 342 may jitter.

Figure 3B:
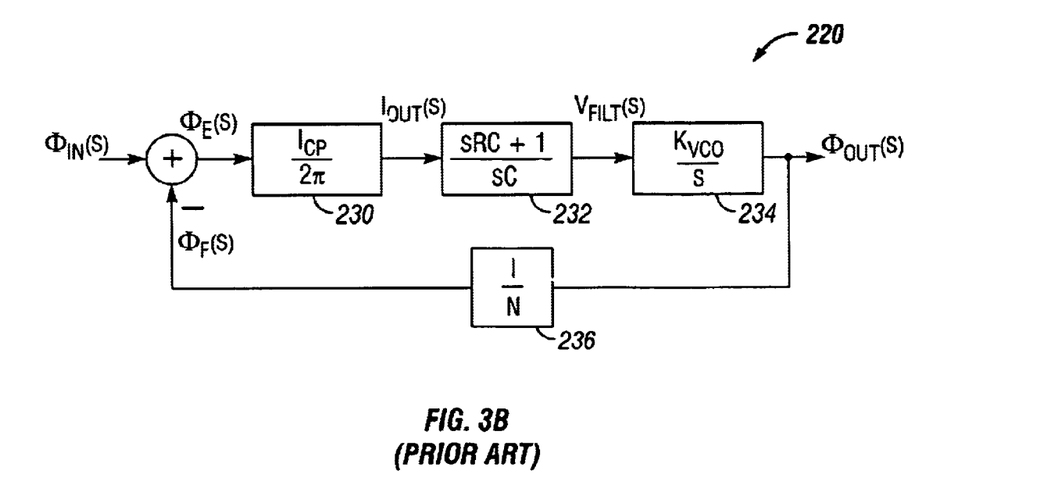
FIG. 3b shows a control diagram of a phase locked loop.

In FIG. 3b, the frequency response of the PLL 220 may be analyzed with a Laplace transform approximation, where the sample operation of the phase-frequency detector is ignored. This approximation is useful for loop bandwidths about a decade or more below the operating frequency of the PLL. This loop bandwidth constraint is also required for stability due to the reduced phase margin near the higher order poles that result from the delay around the sampled feedback loop. The modeled charge pump 230 adds or removes charge to its output depending on the state of input control signals, typically up or down pulses (not shown). Both pulses may be 'on' at the same time, however, if the up or the down pulse remains 'on' longer than the other, the net charge at the output of the charge pump 230 increases or decreases. The charge pump gain may be modeled as a linear gain versus phase error where $I_{OUT}(s)/\Phi_E(s)=I_{CP}/2\pi$. The loop filter 232 may be modeled as a series combination of a capacitor, C, and a resistor, R, connected from $I_{OUT}$ to ground. The loop filter 232 transforms the output of the charge pump, $I_{OUT}$, into the voltage-controlled oscillator input voltage, $V_{FILT}$. The Laplace transform of the series resistor and capacitor in the loop filter 232 is $V_{FILT}(s)/I_{OUT}(s)=(sRC+1)/(sC)$. The transfer function of the capacitor and resistor shows that a zero is added that adds stability to the PLL loop. The voltage-controlled oscillator 234 outputs a clock that has a frequency proportional to the input voltage $V_{FILT}$. The Laplace transform of the voltage-controlled oscillator 234 is $\Phi_{OUT}(s)/V_{FILT}(s)=I_{CP}/V_{FILT}(s)=K_{VCO}/s$. The closed-loop transfer function can now be derived as $H(s)=\Phi_{OUT}(s)/\Phi_{IN}(s)=[(RK_{VCO}I_{CP}/2\pi)/(s+1/RC)]/[s^2+s\ RCK_{VCO}I_{CP}/2\pi NC+K_{VCO}I_{CP}/2\pi NC]$. $H(s)$ is a second order system that has one pole from the loop filter 232 and one pole from the voltage-controlled oscillator 234, and one zero from the resistor, R, in the loop filter 232. The transfer function $H(s)$ has a natural frequency $\omega_n=(K_{VCO}I_{CP}/2\pi NC)^{0.5}$ and a damping factor $\zeta=RC\omega_n/2$.

The loop bandwidth is defined as the frequency at which the output magnitude is 3 dB lower than when the input is DC. Loop bandwidth is not the same as natural frequency, although they are often close. Once $\zeta$, $\omega_n$, $K_{VCO}$, and $I_{CP}$ are chosen, the values for R and C can be determined for any selected loop bandwidth. Low loop bandwidth allows the PLL to filter input jitter. High loop bandwidth allows the PLL to follow and compensate for output error induced by power supply noise. Thus, a design tradeoff must be made in the loop bandwidth of the PLL. The value for C has a large effect on loop bandwidth and natural frequency. Optimizing the PLL loop bandwidth relates to balancing the effect and treatment of input error with the PLL loop's speed of response to compensate for output error induced by power supply noise.

In order to facilitate the achievement of improved/optimal PLL performance, embodiments of the present invention relate to a PLL that includes an input receiver that reduces a static phase error of the PLL. Embodiments of the present invention further relate to a PLL that uses a receiver circuit to match delays of a system clock signal and a feedback loop signal at an input of the PLL. Embodiments of the present invention further relate to a PLL that uses a receiver circuit to minimize delays of a system clock signal and a feedback loop signal at an input of the PLL.

Figure 4A:
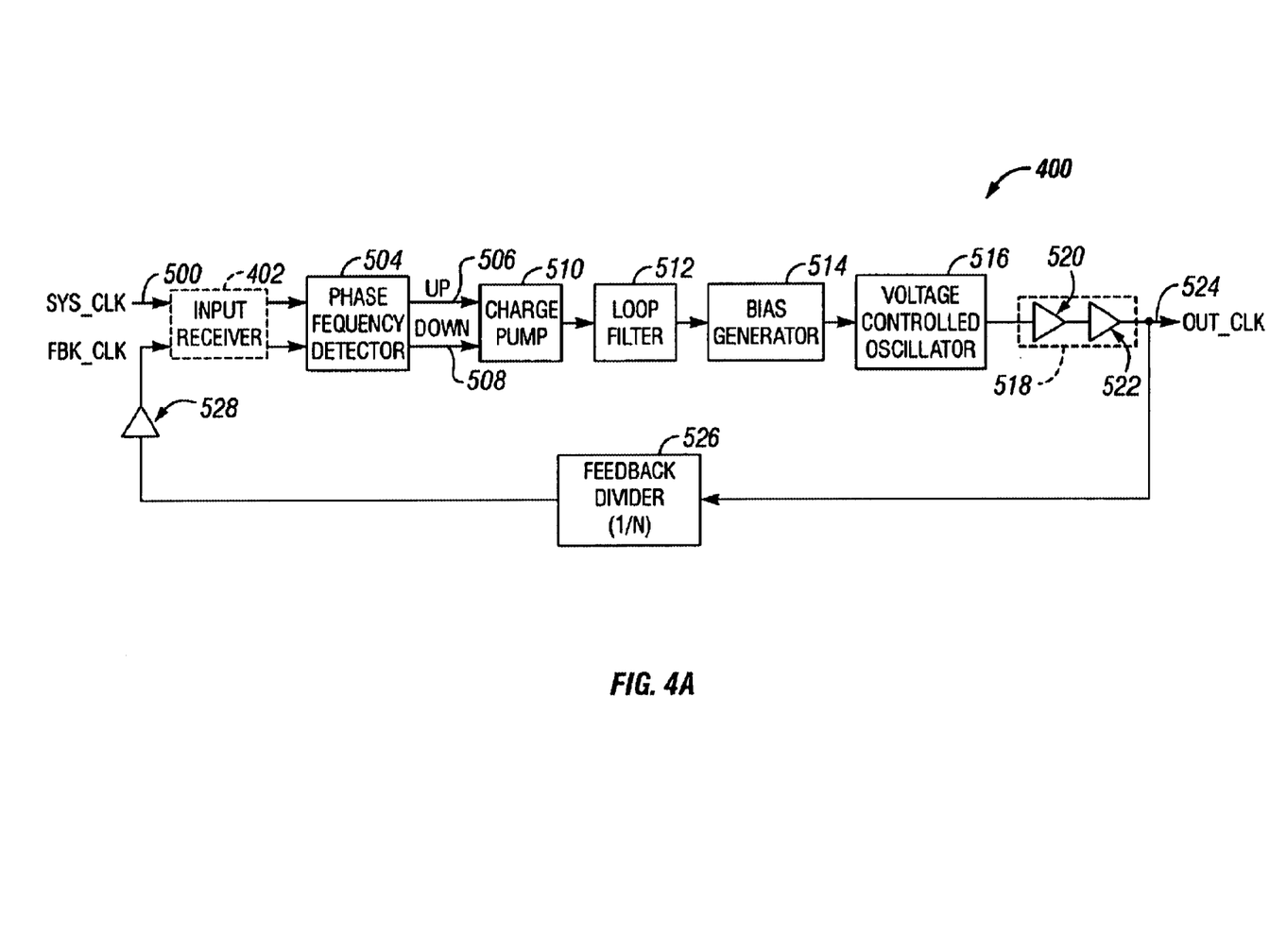
FIG. 4a shows a phase locked loop in accordance with an embodiment of the present invention.
Figure 4B:
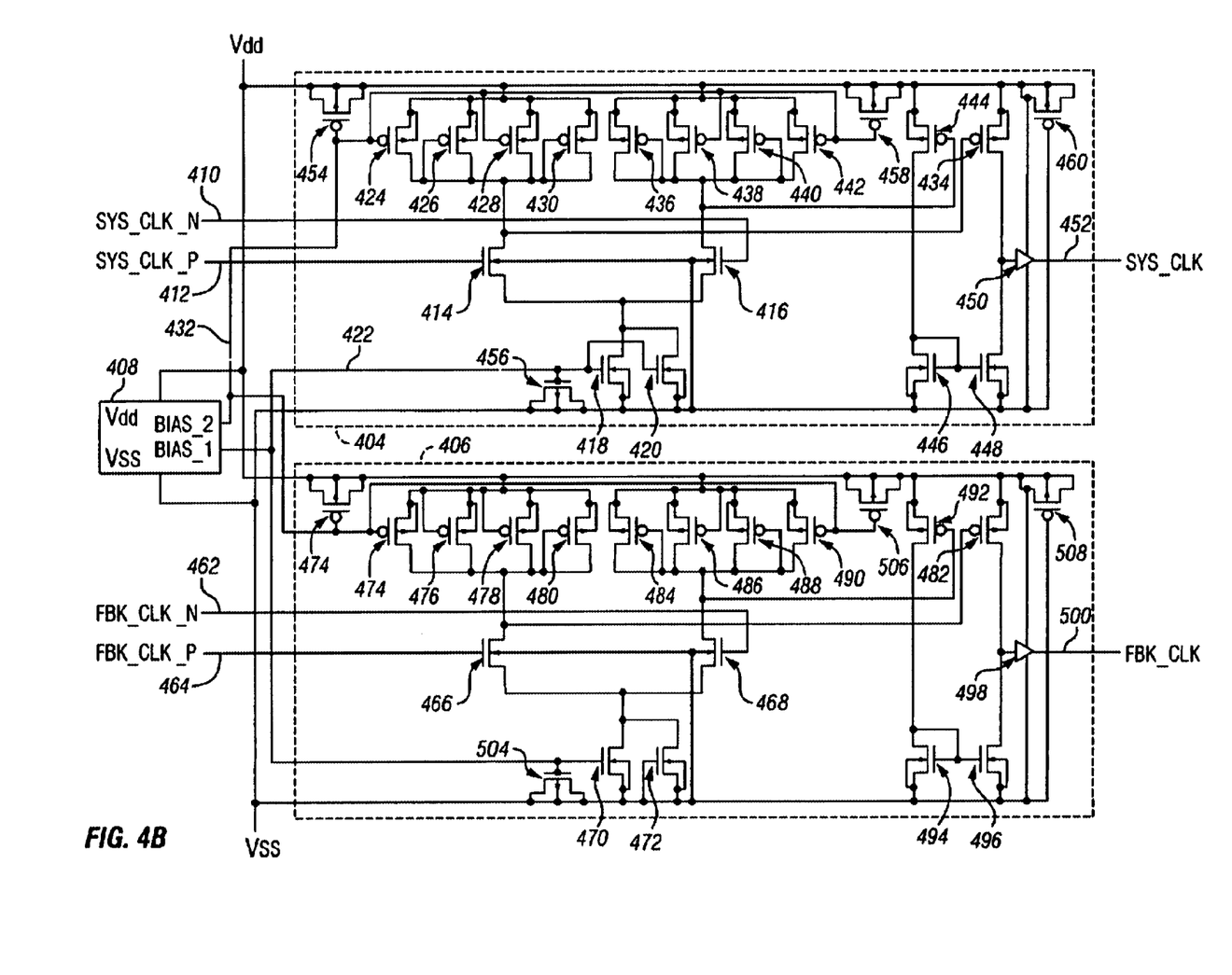

FIG. 4a shows a PLL 400 in accordance with an exemplary embodiment of the present invention. The PLL 400 includes an input receiver 402 that inputs a system clock 500 (labeled in FIG. 4a as SYS_CLK) and a feedback clock 502 (labeled in FIG. 4a as FBK_CLK). The input receiver 402, as will be described below with reference to FIG. 4b, is configured to substantially match and/or minimize the delays of the system clock 500 and the feedback clock 502. Thereafter, the input receiver 402 outputs the delay matched system and feedback clocks to a phase frequency detector 504, which compares the phases of the delay matched system and feedback clocks. Depending on the comparison, the phase frequency detector 504 outputs UP and DOWN pulses 506 and 508 to a charge pump 510, which then outputs to a loop filter 512. The loop filter 512 controls the voltage value of an input to a bias generator 514, which, in turn, controls a voltage controlled oscillator 516. An output from the voltage controlled oscillator 516 propagates through a clock distribution network 518 (modeled in FIG. 4a as buffers 520 and 522) and serves as an output clock 524 of the PLL 400 (labeled in FIG. 4a as CHIP_CLK). The output clock 524 is fed back through the PLL 400 to a feedback divider 526, which, in turn, outputs to a buffer 528 that generates the feedback clock 502 to the input receiver 402.

Regarding a PLL, because a system clock is typically partial-swing and a feedback clock is typically full-swing, and because a system clock typically has a significantly lower frequency than a feedback clock, the treatment of these signals by buffers results in skewed propagation delays between the system and feedback clocks through their respective buffers. The present invention incorporates an input receiver that is configured to be able to substantially match delays of the system clock and feedback clock, thereby reducing input jitter and allowing for a higher loop bandwidth.

FIG. 4b shows an input receiver 402 in accordance with the exemplary embodiment shown in FIG. 4a. From a high level, the input receiver 402 uses a system clock path 404, a feedback clock path 406, and a bias control stage 408.

The system clock path 404 includes a differential input pair for receiving differential components of the system clock, SYS_CLK_N 410 and SYS_CLK_P 412, where the differential input pair is formed by transistors 414 and 416. Current flow through transistor 414 is dependent on transistors 418 and 420 because a first non-gate terminal of transistor 414 is connected to non-gate terminal of transistors 418 and 420. Transistors 418 and 420 are controlled by a first bias signal, BIAS_1 422, generated from the bias control stage 408. Current flow through transistor 414 is also dependent on transistors 424, 426, 428, and 430 because a second non-gate terminal of transistor 414 is connected to non-gate terminals of transistors 424, 426, 428, and 430. Transistors 424, 426, 428, and 430 serve as load resistances, where the resistance values of transistors 424 and 428 are dependent on a second bias signal, BIAS_2 432, generated from the bias control stage 408, and where the resistance values of transistors 426 and 430 are not dependent on the second bias signal 432. Further, as shown in FIG. 4b, an input to transistor 434 is connected to a non-gate terminal of transistor 414 and is thus dependent on the amount of current flow through transistors 424, 426, 428, 430, 414, 418, and 420.

Current flow through transistor 416 is dependent on transistors 418 and 420 because a first non-gate terminal of transistor 416 is connected to non-gate terminal of transistors 418 and 420. As mentioned above, transistors 418 and 420 are controlled by the first bias signal 422. Current flow through transistor 416 is also dependent on transistors 436, 438, 440, and 442 because a second non-gate terminal of transistor 416 is connected to non-gate terminals of transistors 436, 438, 440, and 442. Transistors 436, 438, 440, and 442 serve as load resistances, where the resistance values of transistors 438 and 442 are dependent on the second bias signal 432, and where the resistance values of transistors 436 and 440 are not dependent on the second bias signal 432. Further, as shown in FIG. 4b, an input to transistor 444 is connected to a non-gate terminal of transistor 416 and is thus dependent on the amount of current flow through transistors 436, 438, 440, 442, 416, 418, and 420.

Based on the input to transistor 444, a particular amount of current flows to a non-gate terminal of transistor 446 and to gate terminals of transistors 446 and 448. A non-gate terminal of transistor 448 is connected to an input of a buffer 450, where the buffer 450 outputs the system clock, SYS_CLK 452. A non-gate terminal of transistor 434 is also connected to the input of the buffer 450. Thus, the value of the system clock 452 is dependent on the inputs to transistors 434 and 444.

For purposes of this application, transistors 444, 446, 448, and 434 and buffer 450 form a "first output stage." In addition, those skilled in the art will understand that transistors 454, 456, 458, and 460 serve as transistor-formed capacitances that are used to decouple noise from particular signals.

The feedback clock path 406 includes a differential input pair for receiving differential components of the system clock, FBK_CLK_N 462 and FBK_CLK_P 464, where the differential input pair is formed by transistors 466 and 468. Current flow through transistor 466 is dependent on transistors 470 and 472 because a first non-gate terminal of transistor 466 is connected to non-gate terminal of transistors 470 and 472. Transistor 470 is controlled by the first bias signal 422 and transistor 472 is not dependent on the first bias signal 422. Current flow through transistor 466 is also dependent on transistors 474, 476, 478, and 480 because a second non-gate terminal of transistor 466 is connected to non-gate terminals of transistors 474, 476, 478, and 480. Transistors 474, 476, 478, and 480 serve as load resistances, where the resistance value of transistor 474 is dependent on the second bias signal 432, where the resistance value of transistor 480 is not dependent on the second bias signal 432, and where transistors 476 and 478 are 'off' due to their inputs being connected to Vdd. Further, as shown in FIG. 4b, an input to transistor 482 is connected to a non-gate terminal of transistor 466 and is thus dependent on the amount of current flow through transistors 474, 480, 466, 470, and 472.

Current flow through transistor 468 is dependent on transistors 470 and 472 because a first non-gate terminal of transistor 468 is connected to non-gate terminal of transistors 470 and 472. As mentioned above, transistor 470 is controlled by the first bias signal 422 and transistor 472 operates independent of the first bias signal 422. Current flow through transistor 468 is also dependent on transistors 484, 486, 488, and 490 because a second non-gate terminal of transistor 468 is connected to non-gate terminals of transistors 484, 486, 488, and 490. Transistors 484, 486, 488, and 490 serve as load resistances, where the resistance value of transistor 490 is dependent on the second bias signal 432, where the resistance value of transistor 484 is not dependent on the second bias signal 432, and where transistors 486 and 488 are 'off' due to their inputs being connected to Vdd. Further, as shown in FIG. 4b, an input to transistor 492 is connected to a non-gate terminal of transistor 468 and is thus dependent on the amount of current flow through transistors 484, 490, 468, 470, and 472.

Based on the input to transistor 492, a particular amount of current flows to a non-gate terminal of transistor 494 and to gate terminals of transistors 494 and 496. A non-gate terminal of transistor 496 is connected to an input of a buffer 498, where the buffer 498 outputs the feedback clock, FBK_CLK 500. A non-gate terminal of transistor 482 is also connected to the input of the buffer 498. Thus, the value of the feedback clock 500 is dependent on the inputs to transistors 482 and 492.

For purposes of this application, transistors 492, 494, 496, and 482 and buffer 498 form a "second output stage." In addition, those skilled in the art will understand that transistors 502, 504, 506, and 508 serve as transistor-formed capacitances that are used to decouple noise from particular signals.

In examining the exemplary embodiment of the PLL input receiver 402 shown in FIG. 4b, one of ordinary skill in the art will note that the layout of the system clock path 404 is substantially similar to the layout of the feedback clock path

406. However, the amount of current flow and effective load resistance associated with the system clock path 404 is selectively different from the amount of current flow and effective load resistance associated with the feedback clock path 406. The difference in current flow amounts is achieved by a connection of both of the inputs to transistors 418 and 420 to the first bias signal 422 in the system clock path 404 and a connection of only one of the inputs to transistors 470 and 472 to the first bias signal 422 in the feedback clock path 406, where the size of the transistor 418 and transistor 420 is substantially the same. The difference in effective load resistances is achieved by switching 'off' half of the load resistances, i.e., transistors 476, 478, 486, and 488, in the feedback clock path 406 by connecting their inputs to Vdd, whereas none of the load resistances in the system clock path 404 are intentionally switched 'off.'

Thus, for example, if the amount of current flow in the feedback clock path 406 is I, the amount of current flow in the system clock path 404 is 2I because transistor 420 is in parallel with transistor 418 and facilitates current flow dependent on the first bias signal 422, whereas transistor 472, which is in parallel with transistor 470, does not facilitate current flow due to its input being connected to Vss. Furthermore, if the resistance provided by the load resistances in the feedback clock path 406 is R, the resistance provided by the load resistances in the system clock path 404 is R/2 because there are twice as many non-'off' load resistances in the system clock path 404 than there are in the feedback clock path 406. Therefore, the signal swing of the system clock 452 and the feedback clock 500 is matched, and accordingly, a point of operation may be achieved at which the propagation delay of the system clock through the input receiver 402 and the propagation delay of the feedback clock through the input receiver 402 match, or substantially match. Further, those skilled in the art will appreciate that by facilitating the control of the propagation delays of the system and feedback clocks through the input receiver 402, the propagation delays of the system and feedback clocks may be minimized.

Those skilled in the art will appreciate that the 2:1 ratio discussed above with respect to current flow amounts and effective resistances of the system clock and feedback clock paths 404 and 406 may vary of be varied depending on circuit constraints, simulations, and performance goals. For example, depending on particular parameters, the load resistances in the feedback clock and system clock paths 406 and 404 may be selectively switched 'off' to achieve a particular performance level.

Further, those skilled in the art will appreciate that by matching/minimizing the delays of a system clock and a feedback clock at an input of a PLL, static phase error of the PLL is reduced.

Those skilled in the art will also appreciate that the input receiver, in addition to substantially matching the propagation delays of the system and feedback clocks through the input receiver, the input receiver outputs buffered versions of the system and feedback clocks.

Advantages of the present invention may include one or more of the following. In some embodiments, because a phase locked loop includes an input receiver that facilitates the matching of delays of a system clock and a feedback clock at an input to the phase locked loop, static phase error of the phase locked loop is reduced.

In some embodiments, because a phase locked loop includes an input receiver that facilitates the reducing of delays of a system clock and a feedback clock at an input to the phase locked loop, phase locked loop performance is improved.

In some embodiments, because a phase locked loop includes an input receiver that is selectively controllable to vary/adjust delays of a system clock and a feedback clock, a designer has increased flexibility in achieving desired phase locked loop performance.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A phase locked loop, comprising:
   a voltage controlled oscillator that generates an output clock signal dependent on an input thereto;
   an input receiver comprising an input clock path and a feedback clock path, wherein the input receiver is arranged to modulate a delay of an input clock signal through the input clock path and a delay of a feedback clock signal through the feedback clock path;
   a phase frequency detector that detects a phase difference between the substantially delay matched input clock signal and feedback clock signal; and
   a bias generator, responsive to the phase frequency detector, arranged to provide a voltage to the input of the voltage controlled oscillator.

2. The phase locked loop of claim 1, wherein the input clock signal serves as an input to the phase locked loop.

3. The phase locked loop of claim 1, wherein the feedback clock signal is dependent on the output clock signal.

4. The phase locked loop of claim 1, wherein the input clock path comprises:
   a first differential input arranged to receive differential components of the input clock signal, wherein the first differential input is operatively connected to first input clock path circuitry at least partially responsive to a first bias signal and to second input clock path circuitry at least partially responsive to a second bias signal.

5. The phase locked loop of claim 4, wherein the first and second bias signals are generated by a bias control stage.

6. The phase locked loop of claim 4, wherein the input receiver further comprises:
   a first output stage responsive to the first differential input, the first input clock path circuitry, and the second input clock path circuitry.

7. The phase locked loop of claim 4, wherein the first input clock path circuitry comprises:
   a first device, responsive to the first bias signal, that facilitates current flow in the input clock path.

8. The phase locked loop of claim 7, wherein the first device is a transistor.

9. The phase locked loop of claim 4, wherein the second input clock path circuitry comprises:
   a second device, responsive to the second bias signal, that provides a load resistance in the input clock path.

10. The phase locked loop of claim 9, wherein the second device is a transistor.

11. The phase locked loop of claim 4, wherein the feedback clock path comprises:
   a second differential input arranged to receive differential components of the feedback clock signal, wherein the second differential input is operatively connected to first feedback clock path circuitry at least partially responsive to the first bias signal and to second feedback clock path circuitry at least partially responsive to the second bias signal.

12. The phase locked loop of claim 11, wherein the input receiver further comprises:
a second output stage responsive to the second differential input, the first feedback clock path circuitry, and the second feedback clock path circuitry,
wherein the first output stage outputs a buffered input clock signal, and
wherein the second output stage outputs a buffered feedback clock signal.

13. The phase looked loop of claim 11, wherein the first feedback clock path circuitry comprises:
a first device, responsive to the first bias signal, that facilitates current flow in the feedback clock path.

14. The phase locked loop of claim 13, wherein the first device is a transistor.

15. The phase locked loop of claim 11, wherein the second feedback clock path circuitry comprises:
a second device, responsive to the second bias signal, that provides a load resistance in the feedback clock path.

16. The phase locked loop of claim 15, wherein the second device is a transistor.

17. The phase locked loop of claim 11, wherein the first input clock path circuitry, the second input clock path circuitry, the first feedback clock path circuitry, and the second feedback clock path circuitry are configured to substantially match the delay of the input clock signal through the input receiver and the delay of the feedback clock signal through the input receiver.

18. An integrated circuit, comprising:
a clock path used for propagating a system clock;
a clock distribution network used for propagating a chip clock; and
a phase locked loop that generates the chip clock based on the system clock, wherein the phase locked loop comprises:
a voltage controlled oscillator that generates an output clock signal dependent on an input thereto;
an input receiver arranged to modulate delays through the input receiver of the system clock and a feedback clock;
a phase frequency detector that detects a phase difference between the substantially delay matched system clock and feedback clock; and
a bias generator, responsive to the phase frequency detector, arranged to provide a voltage to the input of the voltage controlled oscillator.

19. The integrated circuit of claim 18, wherein the feedback clock is dependent on the chip clock.

20. The integrated circuit of claim 18, wherein the input receiver comprises:
a first differential input arranged to receive differential components of the system clock, wherein the first differential input is operatively connected to a first device responsive to a first bias signal and to a second device responsive to a second bias signal.

21. The integrated circuit of claim 20, further comprising:
a bias control stage that generates the first bias signal and the second bias signal.

22. The integrated circuit of claim 20, wherein the first and second bias signals are set in order to match the delays of the feedback clock and the system clock.

23. The integrated circuit of claim 20, wherein the input receiver further comprises:
a second differential input arranged to receive differential components of the feedback clock, wherein the second differential input is operatively connected to a third device responsive to the first bias signal and to a fourth device responsive to the second bias signal.

24. The integrated circuit of claim 23, wherein the first, second, third, and fourth devices are transistors.

25. The integrated circuit of claim 23, wherein the input receiver further comprises:
a first output stage responsive to current flow through the first differential input; and
a second output stage responsive to current flow through the second differential input,
wherein the first output stage outputs a buffered input clock signal, and wherein the second output stage outputs a buffered feedback clock signal.

26. The integrated circuit of claim 25, wherein the phase frequency detector is responsive to the buffered input clock signal and the buffered feedback clock signal.

27. An integrated circuit having a phase locked loop that inputs an input clock signal, the phase locked loop comprising:
oscillator means for generating an output clock signal;
delay matching means for delays through the delay matching means of the input clock signal and a feedback clock signal, wherein the feedback clock signal is dependent on the output clock signal;
comparing means for comparing the substantially delay matched input clock signal and feedback clock signal; and
means for generating a voltage to the oscillator means based on the comparing means.

28. The integrated circuit of claim 27, further comprising:
means for generating a first bias signal and a second bias signal.

29. The integrated circuit of claim 28, wherein the delay matching means comprises:
first input means for inputting the input clock signal;
second input means for inputting the feedback clock signal;
first circuitry responsive to the first bias signal;
second circuitry responsive to the second bias signal;
first output means for generating a buffered input clock signal, wherein the first output means is responsive to the first input means, the first circuitry, and the second circuitry; and
second output means for generating a buffered feedback clock signal, wherein the second output means if responsive to the second input means, the first circuitry, and the second circuitry.

30. A method for performing phase locked loop operations, comprising:
inputting an input clock signal and a feedback clock signal;
buffering the input clock signal and the feedback clock signal, wherein the buffering comprises modulating delays of the input clock signal and the feedback clock signal;
comparing the substantially delay matched input clock signal and feedback clock signal; and
generating an output clock signal based on the comparison.

31. The method of claim 30, wherein the feedback clock signal is based on the output clock signal.

32. The method of claim 30, further comprising:

generating a buffered input clock signal and a buffered feedback clock signal.

33. The method of claim 32, further comprising:

substantially matching a signal swing of the buffered input clock signal and a signal swing of the buffered feedback clock signal.

34. The method of claim 30, further comprising:

generating a first bias signal and a second bias signal.

35. The method of claim 34, wherein substantially matching delays of the input clock signal and the feedback clock signal comprises:

outputting a buffered input clock signal dependent on the input clock signal, the first bias signal, and the second bias signal; and outputting a buffered feedback clock signal dependent on the feedback clock signal, the first bias signal, and the second bias signal.

* * * * *

UNITED STATES PATENT AND TRADEMARK OFFICE
CERTIFICATE OF CORRECTION

PATENT NO. : 6,778,027 B2
DATED : August 17, 2004
INVENTOR(S) : Claude R. Gauthier et al.

It is certified that error appears in the above-identified patent and that said Letters Patent is hereby corrected as shown below:

Column 10,
Line 52, should read -- is -- instead of "if".

Signed and Sealed this

Seventh Day of December, 2004

JON W. DUDAS
*Director of the United States Patent and Trademark Office*